(12) United States Patent
Greiner

(10) Patent No.: US 7,581,074 B2
(45) Date of Patent: Aug. 25, 2009

(54) FACILITATING USE OF STORAGE ACCESS KEYS TO ACCESS STORAGE

(75) Inventor: Dan F. Greiner, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 438 days.

(21) Appl. No.: 11/437,218

(22) Filed: May 19, 2006

(65) Prior Publication Data

US 2007/0271432 A1  Nov. 22, 2007

(51) Int. Cl.
*G06F 12/00* (2006.01)
(52) U.S. Cl. .................. 711/164; 711/165; 711/154
(58) Field of Classification Search ............ 711/163, 711/164, 165, 152, 154
See application file for complete search history.

(56) References Cited

U.S. PATENT DOCUMENTS

| | | | |
|---|---|---|---|
| 4,035,779 A | 7/1977 | Birney et al. ............ 364/200 |
| 4,050,060 A * | 9/1977 | Birney et al. ............ 711/164 |
| 4,521,846 A | 6/1985 | Scalzi et al. ............ 364/200 |
| 4,979,098 A | 12/1990 | Baum et al. |
| 5,226,132 A | 7/1993 | Yamamoto et al. |
| 5,287,475 A | 2/1994 | Sawamoto |
| 5,305,458 A | 4/1994 | Motomura et al. |
| 5,481,688 A | 1/1996 | Takagi |
| 5,615,354 A | 3/1997 | Hill et al. ............ 395/493 |
| 5,911,151 A | 6/1999 | Circello et al. ............ 711/201 |
| 6,601,160 B2 | 7/2003 | Catherwood et al. ....... 712/225 |
| 6,708,268 B1 | 3/2004 | Boles et al. ............ 712/220 |
| 2003/0120854 A1 | 6/2003 | Chen ............ 711/2 |
| 2004/0006679 A1 | 1/2004 | Chiba et al. |
| 2006/0259714 A1 * | 11/2006 | De Santis et al. ............ 711/154 |

FOREIGN PATENT DOCUMENTS

| | | |
|---|---|---|
| EP | 0085755 | 2/1989 |
| EP | 0 327707 A2 | 8/1989 |
| EP | 0260433 | 11/1994 |
| EP | WO 9956205 A | 11/1999 |
| WO | WO 99/56205 | 11/1999 |

OTHER PUBLICATIONS

"A Computer Architecture with Access Control and Cache Option Tags on Individual Instruction Operands," Anthony S. Fong, pp. 1-5.

"The Evolution of the Sperry Univac 1100 Series: A History, Analysis, and Projection," B. R. Borgerson, M. L. Hanson, and P. A. Hartley, Communications of the ACM, Jan. 1978, vol. 21, No. 1, pp. 25-43.

"z/Architecure—Principles of Operation", SA22-7832-04, pp. 10-53-10-55.

(Continued)

*Primary Examiner*—Jack A Lane
(74) *Attorney, Agent, or Firm*—John E. Campbell

(57) ABSTRACT

Use of storage access keys is facilitated to enable flexible control of storage access. Any selected storage access key is usable to access storage. Storage access keys may be specified in user registers and can override storage access keys indicated in system registers.

18 Claims, 8 Drawing Sheets

OTHER PUBLICATIONS

PCT/EP2006/069916 International Search Report Apr. 5, 2007.
European Search Report EP 06126516.1 1229 Apr. 11, 2007.
European Search Report GB0625511.1 May 19, 2008.
PCT/EP2006/069916 International Search Report May 4, 2007.
GB0709076.4 International Search Report May 19, 2008 POU920060109GB2.
GB0625511.1 Exam Report May 19, 2008 POU920060109GB1.
USPTO Office Actions for U.S. Appl. No. 11/437,952, Inventor Dan F. Greiner, Filed May 19, 2006.

* cited by examiner

FACILITATING USE OF STORAGE ACCESS KEYS TO ACCESS STORAGE

CROSS-REFERENCE TO RELATED APPLICATIONS

This application contains subject matter which is related to the subject matter of the following application, which is assigned to the same assignee as this application. The below listed application is hereby incorporated herein by reference in its entirety:

"MOVE DATA FACILITY WITH OPTIONAL SPECIFICATIONS," Dan F. Greiner, Ser. No. 11/437,952, filed herewith.

TECHNICAL FIELD

This invention relates, in general, to processing within a processing environment, and in particular, to facilitating use of storage access keys to access storage of the processing environment.

BACKGROUND OF THE INVENTION

Storage keys are used to control access to storage. In one example, such as in the z/Architecture offered by International Business Machines Corporation, a storage key is associated with each 4K byte block of storage that is available in the configuration. The storage keys afford protection against improper storing or improper storing and fetching from storage. As examples, a store or store and fetch is permitted only when the storage key matches the storage access key associated with the request for storage access.

Currently, in the z/Architecture, there are several instructions used to designate the storage access keys to be used to control access to storage, such as access to source or target operands designated in instructions. These instructions include, Move with Key (MVCK), Move with Destination Key (MVCDK) and Move with Source Key (MVCSK). With each of these instructions, one access key is specified by the instruction and the other access key is indicated in a program status word (PSW), which is a system register used to control instruction execution within the processing environment.

As an example, with the Move with Destination Key instruction, accesses to the destination operand location are performed by using the key specified in general register 1 and accesses to the source operand location are performed by using the PSW key. Similarly, with the Move with Source Key instruction, accesses to the source operand location are performed by using the key specified in general register 1 and accesses to the destination operand location are performed by using the PSW key. Thus, with each of these instructions, an access key is statically predefined by the instruction itself. Further, with each instruction, one of the access keys must be specified in the PSW.

SUMMARY OF THE INVENTION

Based on the foregoing, a need exists for a facility that is flexible and does not require, for instance, that one of the access keys be selected from the PSW. In particular, a need exists for a facility that allows storage access keys to be selected from one or more user registers rather than system registers, if desired.

In an aspect of the present invention, a method of facilitating storage access within a processing environment is provided. The method includes, for instance, selecting a source access key to be used to control access to a source operand, wherein the selecting includes using a control to select the source access key from one of a user register and a system register, wherein selection of the source access key from the user register overrides designation of the source access key in the system register, if any; selecting a target access key to be used to control access to a target operand, wherein the selecting includes using a control to select the target access key from one of a user register and the system register, wherein selection of the target access key from the user register overrides designation of the target access key in the system register, if any, and wherein the selecting of the target access key is independent of the selecting of the source access key; and using the source access key to control access to the source operand and the target access key to control access to the target operand.

System and computer program products corresponding to the above-summarized method are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

In accordance with an aspect of the present invention, the use of storage access keys is facilitated to enable flexible control of storage access. Any selected storage access keys can be used to access the storage. The selected keys may be chosen from one or more user registers rather than from system registers, if desired. In one example, the selection of storage access keys is included in an instruction to move data. The move data instruction enables optional specifications to be indicated to flexibly control the move operation, and one of the optional specifications includes the designation of zero or more storage access keys. While the description herein is in the context of a move data facility, one or more aspects of the present invention can be employed apart from the move data facility.

Figure 1:
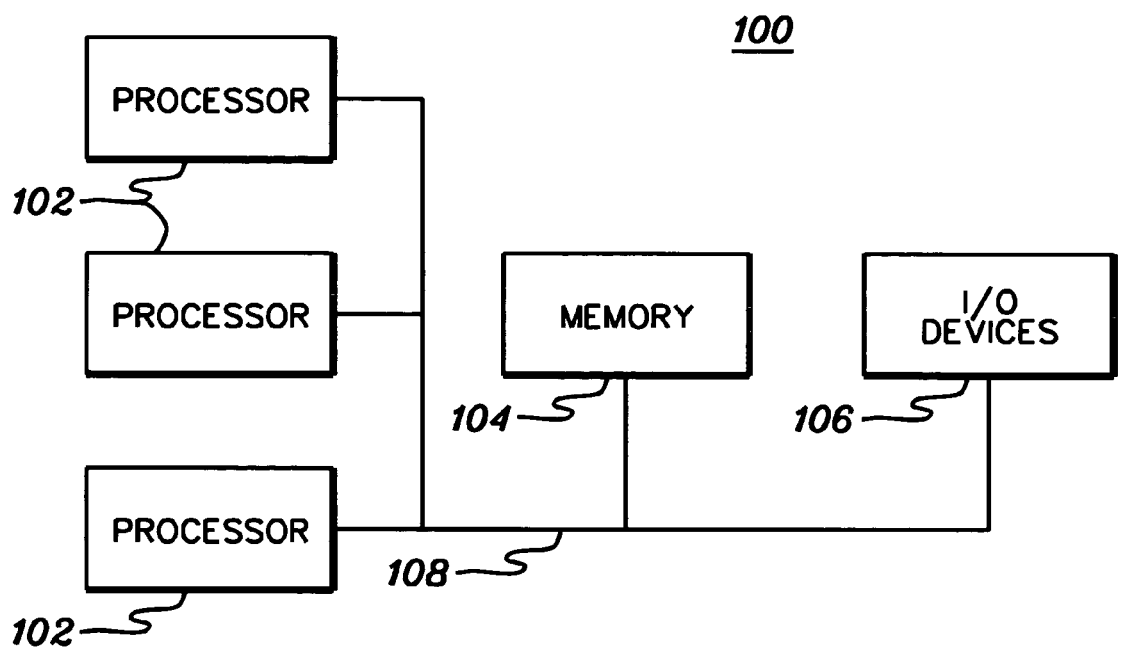
FIG. 1 depicts one embodiment of a processing environment incorporating and using one or more aspects of the present invention.

One embodiment of a processing environment incorporating and using one or more aspects of the present invention is described with reference to FIG. 1. Processing environment 100 is, for instance, a multi-processing environment including a plurality of processors 102 (e.g., central processing units (CPUs)), a memory 104 (e.g., main memory) and one or more input/output (I/O) devices 106 coupled to one another via, for example, one or more buses 108 or other connections.

As one example, each processor 102 is an IBM System Z™ server, offered by International Business Machines Corporation, Armonk, N.Y., and one or more of the processors execute an operating system, such as z/OS®, also offered by International Business Machines Corporation. (z/OS and IBM are registered trademarks of International Business Machines Corporation, Armonk, N.Y., USA. Other names used herein may be registered trademarks, trademarks or product names of International Business Machines Corporation or other companies.)

Figure 2:
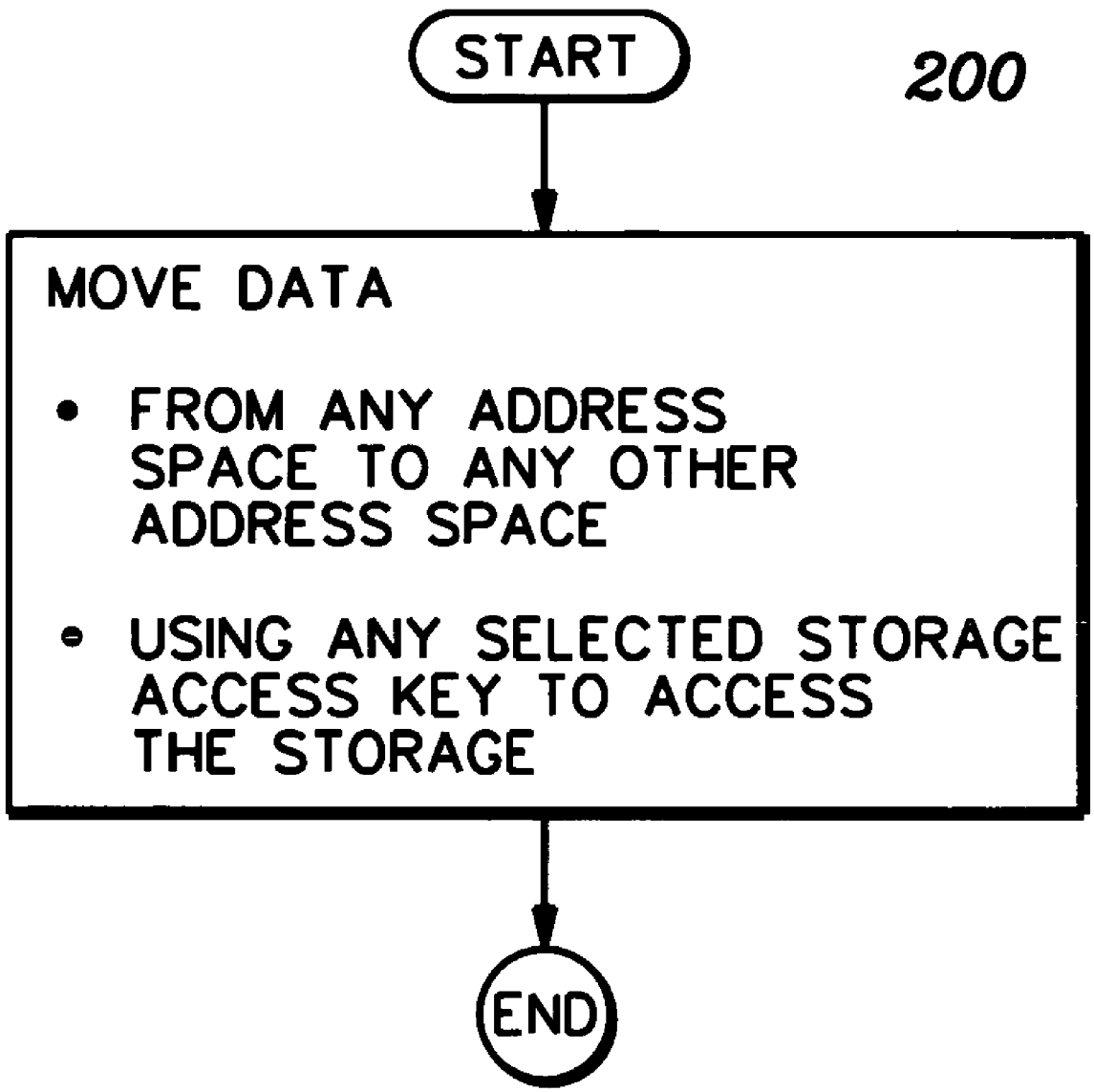
FIG. 2 depicts one embodiment of the logic associated with an overview of a move data facility, in accordance with an aspect of the present invention.

Processing within the processing environment is facilitated by the provision of a move data facility that enables flexible control of a move data operation. With reference to FIG. 2, a general overview of the facility is provided. Data is moved from any address space to any other address space, and in one example, the storage for the move is accessed using any selected storage access keys, STEP 200. The data move is performed, in one embodiment, without requiring modification to the operating system including, for instance, modification to support access register mode. Further, in one embodiment, a single instruction is used that does not require static definition of the address spaces and/or storage access keys. The instruction includes optional specifications that enable the selection of the desired addresses from which/to data is to be moved, and the selection of the storage access keys for accessing the source operand and the target operand of the instruction.

In the embodiment in which an instruction is used to move the data, the instruction can be implemented in many architectures and may be emulated. As examples, the instruction is executed in hardware by a processor; or by emulation of an instruction set that includes this instruction, by software executing on a processing unit having a different native instruction set. In one particular example, the instruction is implemented in the z/Architecture, offered by International Business Machines Corporation, and is referred to herein as a Move with Optional Specifications (MVCOS) instruction.

Figure 3:
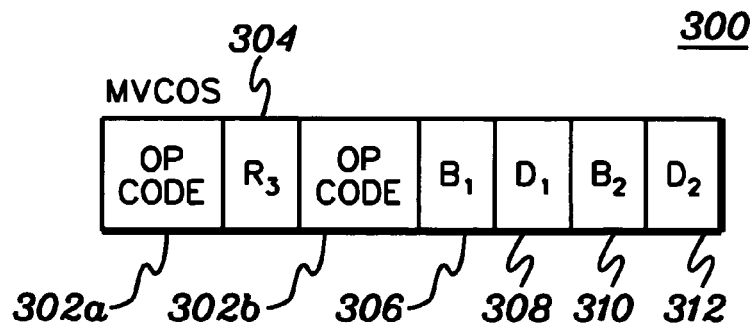
FIG. 3 depicts one example of a format of a Move with Optional Specifications instruction provided in accordance with an aspect of the present invention.

A Move with Optional Specifications instruction 300 (FIG. 3) includes, for instance, an operation code 302a, 302b designating the Move with Optional Specifications instruction; a general register 304, the contents of which specify a third operand used by the instruction, and includes, for instance, an unsigned binary integer called the true length, which is the true length of the data to be moved; a base register 306, which may be any of sixteen general purpose registers of the processing unit and includes a portion of an address of a first operand in storage used by the instruction; a displacement value 308, which is, for instance, an unsigned 12 bit binary number added to the contents of register 306 to provide the address of the first operand in storage; a base register 310, which again is any of the sixteen general purpose registers in the processing unit and includes a portion of an address of a second operand in storage used by the instruction; and a displacement value 312, which is added to the contents of register 310 to provide the address of the second operand in storage for the instruction. The addresses of the first and second operands are virtual addresses, in one embodiment.

In addition to the registers described above, the Move with Optional Specifications instruction also implicitly uses a general register, general register 0, that does not have to be encoded in the instruction, but is used by the instruction. This register is referred to herein as a user register, since it is intended to be updated by users of the move instruction.

Figure 4A:
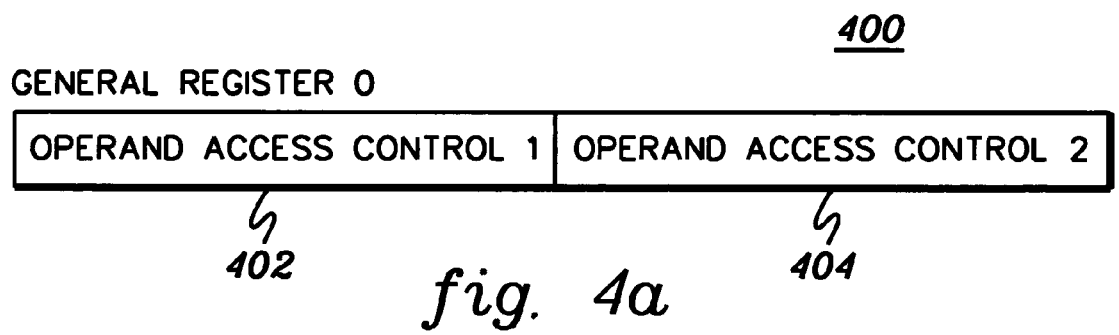
FIG. 4a depicts one embodiment of the fields of general register 0 used by the Move with Optional Specifications instruction of one aspect of the present invention.
Figure 4B:
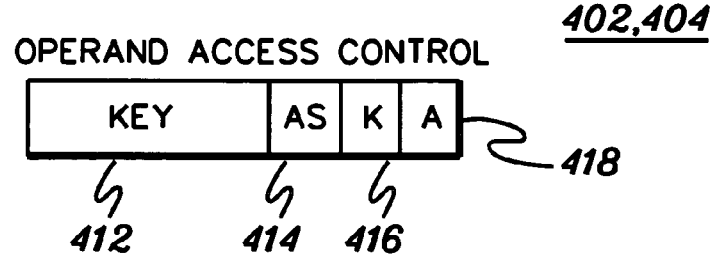
FIG. 4b depicts one embodiment of the fields associated with an operand access control of general register 0, in accordance with an aspect of the present invention.

General register 0 (400, FIG. 4a) includes, for instance, an operand access control (OAC) 1 (402) that is used to control access of the first operand, and operand access control 2 (404) that is used to control access of the second operand. One example of the fields associated with each of operand access controls 402, 404 is described with reference to FIG. 4b. In one example, each operand access control includes the following fields:

Specified Access Key (Key) 412: The specified access key is used to access the operand (e.g., first operand, if OAC 402; and second operand if OAC 404), if the specified access key validity control (K) is one, as an example; otherwise, the specified access key is ignored.

Specified Address Space Control (AS) 414: The specified address space control is used to access the operand when the address space control validity control (A) is one; otherwise, the specified address space control is ignored. As examples, the specified address space control includes: 00 for primary space mode; 01 for access register mode; 10 for secondary space mode; and 11 for home space mode.

Specified Access Key Validity Control (K) 416: This value controls whether a key in a system register, such as the program status word (PSW), or the specified access key is to be used to access the operand. When the control is 0, for instance, the PSW key is used. However, when the control is 1, for instance, the specified access key is used. As used herein, a system register is a register in which the user of the move instruction is not expected and/or allowed to directly revise.

Specified Address Space Control Validity Control (A) 418: This controls whether the address space control in the current PSW or the address space control in the specified address space control is to be used to access the operand. When the A control is 0, for instance, the address space control in the current PSW is used. When the A control is 1, for instance, the specified address space control is used.

Although examples of registers are described above, each of the registers may include more, less or different information. Further, each may include additional data not necessarily needed in one or more aspects of the present invention. The specific location within the registers for the information is implementation and/or architecture dependent.

Figure 5:
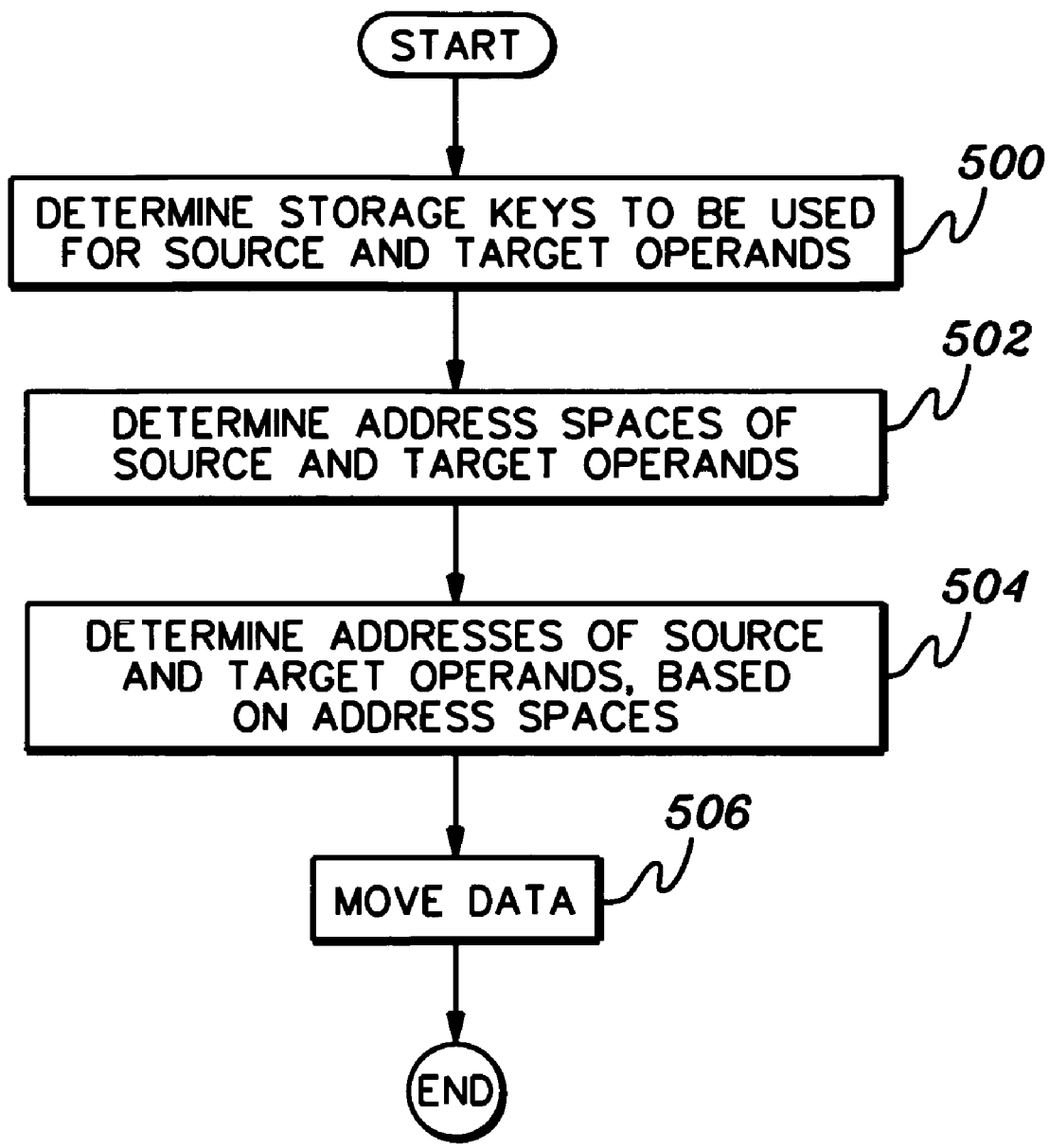
FIG. 5 depicts one embodiment of the logic associated with executing the Move with Optional Specifications instruction, in accordance with an aspect of the present invention.

One embodiment of the logic associated with the Move with Optional Specifications instruction is described with reference to FIG. 5. As one example, this instruction is executed by one or more processors of the processing environment.

In response to executing the instruction, a determination is made as to the storage keys to be used for the source and target operands, STEP 500. As used herein, the source operand is the second operand of the instruction and the target operand is the first operand. Each of the source operand and the target operand is to have its own storage access key associated therewith. The storage access key for a particular operand is specified in the operand access control for that operand (e.g., OAC 1 for the target operand or OAC 2 for the source operand) or in the program status word.

Figure 6:
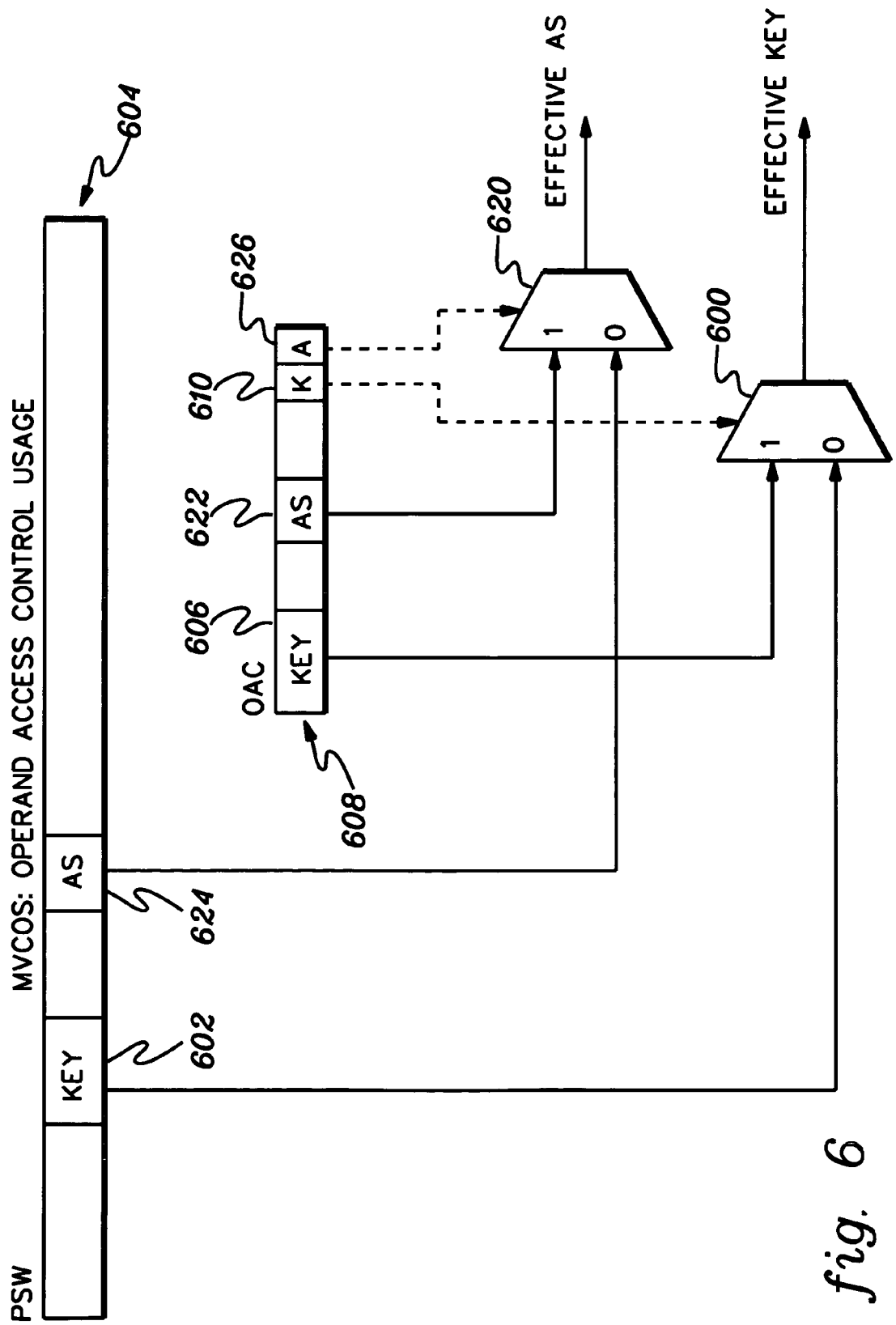
FIG. 6 depicts one embodiment of employing an operand access control to determine the specified address space and access key to be used in the move operation, in accordance with an aspect of the present invention.

To determine whether the storage access key in the operand access control or the program status word is to be used for a particular operand, a selection protocol is employed. For instance, as depicted in FIG. 6, a multiplexor 600 is used to select the storage access key. Input to multiplexor 600 is a key 602 of a program status word 604, as well as a key 606 of an operand access control 608. The operand access control employed depends on whether it is the target or source operand for which the determination is being made (e.g., OAC 1 for the target operand or OAC 2 for the source operand). Further input to multiplexor 600 is specified access key validity control 610. If this control is 0, then, in one example, key 602 is used. However, if this control has a value of 1, then key 606 is used. This provides flexibility in the selection of the access key to be used for both the source operand and the target operand.

The selected access key is used in controlling access to storage. For instance, the selected access key is compared to a storage key assigned to the storage being accessed. If the keys match, then access is allowed. If the keys do not match, access is denied.

Returning to FIG. 5, in addition to determining the storage keys to be used, a determination is made as to the address spaces of the source and target operands to be used, STEP 502. As with the storage keys, the selection of the address spaces is also controlled by specifying the desired address space control modes and using a selection control. For instance, as depicted in FIG. 6, a multiplexor 620 is used to select the effective address space. Input to multiplexor 620 is a specified address space control 622 of operand access control 608 (e.g., OAC 1 for the target operand or OAC 2 for the source operand), and an address space control 624 of PSW 604. Further input to multiplexor 620 is a specified address space control validity control 626, which controls whether the address space control of the PSW or the operand access control is to be used to access the operand. When the specified address space control validity control is, for instance, 0, then the address space control 624 in the current PSW is used. However, when the specified address space control validity control is, for instance, 1, then specified address space control 622 is used. The address space control is, for instance, a 2 bit field, which indicates the selected address space mode.

After determining the address spaces from which the source and target operands are to be accessed, the addresses of the source and target operands are determined, STEP 504. In particular, since in this embodiment, the operands are virtual addresses, the virtual addresses are translated to absolute addresses.

Figure 7:
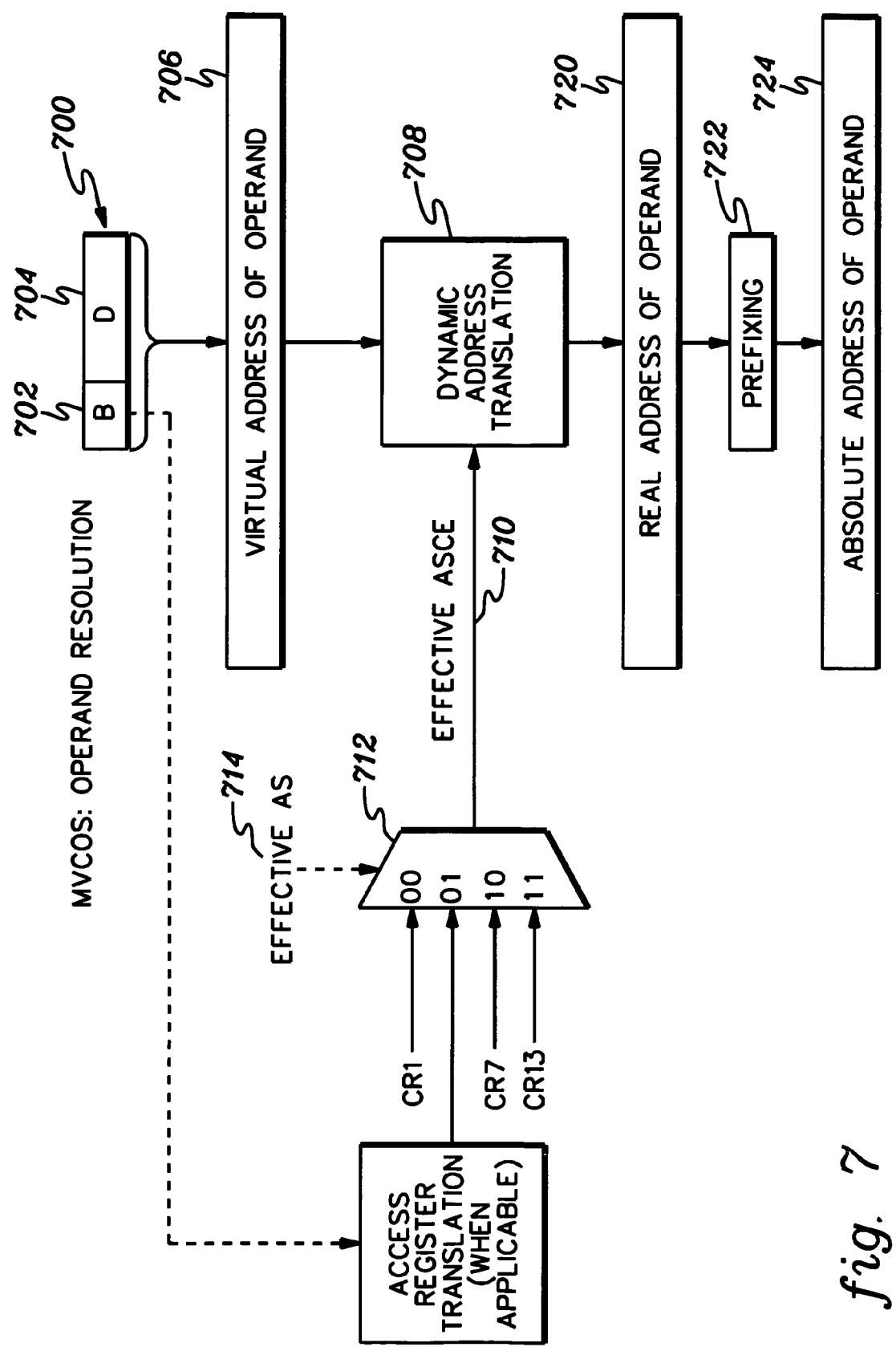
FIG. 7 depicts one embodiment of the logic associated with address resolution, in accordance with an aspect of the present invention.

One embodiment of the logic associated with resolving the operands is described with reference to FIG. 7. An address 700 of an operand to be resolved is specified in the form of a base register 702 and a displacement 704. This is the virtual address 706 of the operand, which is input to dynamic address translation 708. Also input to dynamic address translation is an effective address space control element 710, which is determined from a selection control, such as a multiplexor 712. Input to the multiplexor is the effective address space obtained, for instance, from FIG. 6, as well as various control registers and an access register translation, when applicable.

The output of multiplexor 712 is the effective address space control element (ASCE) that is input to dynamic address translation. For instance, if effective AS 714 is 00, then CR1 is selected, which indicates primary address space mode. Likewise, if effective AS 714 is 01, then access register mode is selected, etc. The address space control element designates one or more particular tables, depending on the input to multiplexor 712, that are used by DAT to translate the virtual address to a real address. The output of the dynamic address translation is a real address of the operand, which is subject to prefixing 722 providing an absolute address 724 of the operand. Prefixing is a mechanism by which rules are applied to determine the absolute address of a real address. Further details associated with dynamic address translation and prefixing, as well as other virtual addressing concepts, are described in *z/Architecture: Principles of Operation,* IBM® Publication No. SA22-7832-04, September 2005, which is hereby incorporated herein by reference in its entirety.

Figure 8:
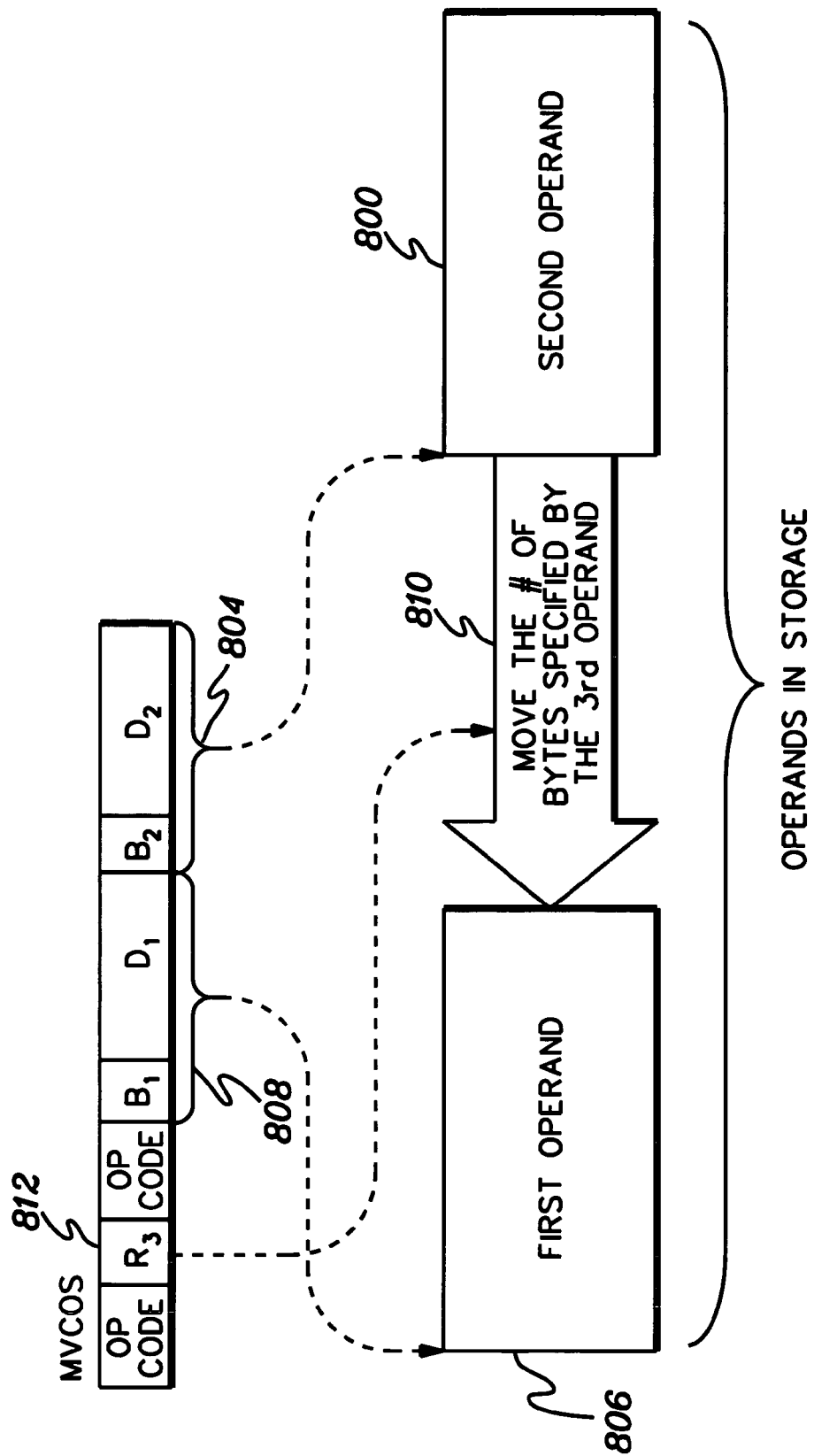
FIG. 8 depicts one embodiment of moving data from a source operand to a target operand, in accordance with an aspect of the present invention.

Subsequent to determining the addresses of the source and target operands, the data is moved from the source operand to the target operand, STEP 506. The amount of data moved is specified by the third operand of the instruction. This is pictorially depicted in FIG. 8. As shown, data of a second operand 800, as designated by $B_2D_2$ 804 is moved to a first operand 806, as designated by $B_1D_1$ 808. The number of bytes moved is specified 810 by a third operand 812. In accordance with an aspect of the present invention, up to, for instance 4,096 characters can be moved in one execution of the instruction. For instance, the designated amount of characters are copied from the source to the target. Multiple executions of the instruction can be used to move additional bytes of data.

Described in detail above is a flexible move data facility that enables the moving of data from any address space to any other address space using any specified access control keys. Further, the amount of data to be moved is specifiable.

An example of moving 16 K bytes of data from the secondary address space to the home address space is depicted below. In this example, the first operand is accessed using the PSW key and the second operand is accessed using Key 5.

| | |
|---|---|
| LA | 3,OPERAND1 |
| LA | 5,OPERAND2 |
| LHI | 7,16384 |
| LLILF | 0,X'00C15083' |
| LOOP MVCOS | 0(3),0(5),7 |
| AHI | 3,4096 |
| AHI | 5,4096 |
| AHI | 7,−4096 |
| BP | LOOP |

In the above example '00C1' are the contents of OAC1 and '5083' are the contents of OAC2. Further, of the OAC, in one example, bits 0-3 (left to right) are the specified key, bits 8-9 are the specified address space control, bit 14 is the specified key validity bit and bit 15 is the specified ASC validity bit.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Figure 9:
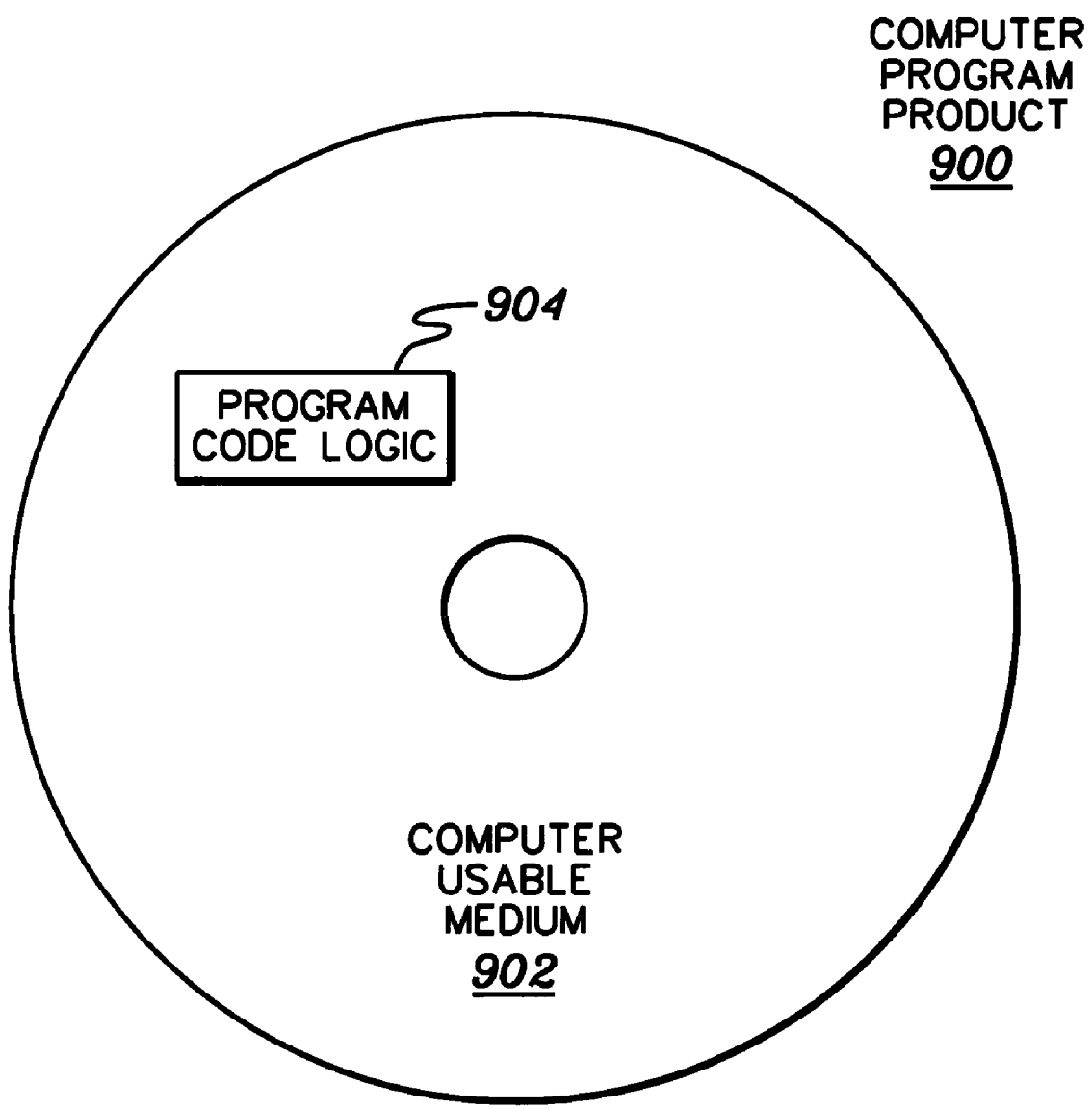
FIG. 9 depicts one example of a computer program product incorporating one or more aspects of the present invention.

One example of an article of manufacture or a computer program product incorporating one or more aspects of the present invention is described with reference to FIG. 9. A computer program product 900 includes, for instance, one or more computer usable media 902 to store computer readable program code means or logic 904 thereon to provide and facilitate one or more aspects of the present invention. The medium can be an electronic, magnetic, optical, electromagnetic, infrared, or semiconductor system (or apparatus or device) or a propagation medium. Examples of a computer readable medium include a semiconductor or solid state memory, magnetic tape, a removable computer diskette, a random access memory (RAM), a read-only memory (ROM), a rigid magnetic disk and an optical disk. Examples of optical disks include compact disk-read only memory (CD-ROM), compact disk-read/write (CD-R/W) and DVD.

A sequence of program instructions or a logical assembly of one or more interrelated modules defined by one or more computer readable program code means or logic direct the performance of one or more aspects of the present invention.

Advantageously, one or more aspects of the present invention provide a facility in which the storage protection key for either or both storage operands can be specified by the program or default values may be used from the program status word. A facility is provided in which the storage access keys need not be statically predefined in an instruction. In a further aspect, a move data facility is provided that can support optional specifications for the move. A facility is provided in which data can be moved from any address space mode (e.g., primary, secondary, access register specified, home or PSW specified) to any other address mode without requiring operating system enhancements, such as, for instance, the provision of access register mode. The address space mode for either operand can be explicitly designated or provided by default in the current program status word. In one embodiment, an instruction is used to move the data from any address space to any other address space. The instruction does not require the static definition of address space modes. Further, the facility provides for moving more data in one execution of the instruction than typically allowed. No new hardware registers or tables are used to provide this functionality.

Although one or more examples have been provided herein, these are only examples. Many variations are possible without departing from the spirit of the present invention. For instance, processing environments other than the example provided herein may include and/or benefit from one or more aspects of the present invention. As an example, one or more processors can be other than IBM System Z™ processors and/or execute operating systems other than z/OS®. Further, the environment need not be based on the z/Architecture, but instead, can be based on other architectures, offered by, for instance, Intel, Sun Microsystems, as well as others. Yet further, the instruction can include other registers or entities other than registers to designate information. Further, different data and/or positioning within the registers and/or entities are possible. Still further, although a maximum of 4096 characters is provided as an example of the number of characters that can be moved in one execution of the move instruction, any other number of characters is possible, including an unlimited number and allowing the instruction to be interruptible. Many other variations exist.

As further examples, system registers other than the PSW can include default values for the address space mode and/or access keys. Also, other registers can be used for one or more of the OACs. Yet further, although values for controls are provided, other values may be used without departing from the spirit of the present invention. Moreover, the use of DAT and/or prefixing to translate from a virtual address to an absolute address is only one example. The translation can be performed in a number of ways, including, but not limited to, table lookups.

Moreover, an environment may include an emulator (e.g., software or other emulation mechanisms), in which a particular architecture or subset thereof is emulated. In such an environment, one or more emulation functions of the emulator can implement one or more aspects of the present invention, even though a computer executing the emulator may have a different architecture than the capabilities being emulated. As one example, in emulation mode, the specific instruction or operation being emulated is decoded, and an appropriate emulation function is built to implement the individual instruction or operation.

In an emulation environment, a host computer includes, for instance, a memory to store instructions and data; an instruction fetch unit to fetch instructions from memory and to optionally, provide local buffering for the fetched instruction; an instruction decode unit to receive the instruction fetch unit and to determine the type of instructions that have been fetched; and an instruction execution unit to execute the instructions. Execution may include loading data into a register for memory; storing data back to memory from a register; or performing some type of arithmetic or logical operation, as determined by the decode unit. In one example, each unit is implemented in software. For instance, the operations being performed by the units are implemented as one or more subroutines within emulator software.

Further, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the available types of network adapters.

As used herein, the term "operand" not only includes and/or refers to operands of an instruction, but also other operands, as well as parameters or arguments passed between functions of programs, or any other data that is passed between entities.

The capabilities of one or more aspects of the present invention can be implemented in software, firmware, hardware or some combination thereof. At least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating storage access within a processing environment, said method comprising:
  fetching an instruction for execution, the instruction being defined for computer execution according to a computer architecture, the instruction having an associated plurality of user registers comprising a source user register, the source user register comprising a source control and a target control, the source user register comprising an access key associated with the source control and an access key associated with the target control;
  executing the fetched instruction, the execution comprising:
  selecting a source access key to be used to control access to a source operand, wherein the selecting comprises using the source control to select the source access key from one of the source user register and a system register, wherein selection of the source access key from the source user register overrides designation of the source access key in the system register, if any;
  selecting a target access key to be used to control access to a target operand, wherein the selecting comprises using the target control to select the target access key from one of the target user register and the system register, wherein selection of the target access key from the target user register overrides designation of the target access key in the system register, if any, and wherein the selecting of the target access key is independent of the selecting of the source access key; and
  using the source access key to control access to the source operand and the target access key to control access to the target operand.

2. The method of claim 1, wherein the system register comprises a program status word used to control instruction execution in the processing environment.

3. The method of claim 1, wherein the instruction comprises a move data instruction comprising
  moving a block of data from a source address space associated with the source access key to a target address space associated with the target access key.

4. The method according to claim 3, wherein the system is has an associated system address space, wherein the user register further comprises a source address space control, a first address space identifier, a target address space control and a second address space identifier comprising:
  based on the source address space control, using the source address space control to determine the source address space is any one of the system address space and an address space identified by the first address space identifier; and
  Based on the target address space control, using the target address space control to determine the target address space is any one of the system address space and an address space identified by the second address space identifier.

5. The method of claim 1, wherein the selecting the source access key and the selecting the target access key are performed during a move data operation within the processing environment.

6. The method according to claim 1, wherein the instruction is fetched and executed by a central processing unit of an alternate computer architecture, the method comprising:
  interpreting the fetched instruction to identify a predetermined software subroutine for emulating the operation of the instruction, the predetermined software subroutine comprising a plurality of instructions; and
  executing the predetermined software subroutine to perform the steps of the method for executing the fetched instruction.

7. A system for facilitating storage access within a processing environment, said system comprising:
  a memory; and
  a central processing unit in communication with the memory, wherein the system is capable of performing a method comprising:
  fetching an instruction for execution, the instruction being defined for computer execution according to a computer architecture, the instruction having an associated plurality of user registers comprising a source user register, the source user register comprising a source control and a target control, the source user register comprising an access key associated with the source control and an access key associated with the target control;
  executing the fetched instruction, the execution comprising:
    selecting a source access key to be used to control access to a source operand, wherein the selecting comprises using the source control to select the source access key from one of the source user register and a system register, wherein selection of the source access key from the source user register overrides designation of the source access key in the system register, if any;
    selecting a target access key to be used to control access to a target operand, wherein the selecting comprises using the target control to select the target access key from one of the target user register and the system register, wherein selection of the target access key from the target user register overrides designation of the target access key in the system register, if any, and wherein the selecting of the target access key is independent of the selecting of the source access key; and
  using the source access key to control access to the source operand and the target access key to control access to the target operand.

8. The system of claim 7, wherein the system register comprises a program status word used to control instruction execution in the processing environment.

9. The system according to claim 7, wherein the instruction is fetched and executed by a central processing unit of an alternate computer architecture, the method comprising:
  interpreting the fetched instruction to identify a predetermined software subroutine for emulating the operation of the instruction, the predetermined software subroutine comprising a plurality of instructions; and
  executing the predetermined software subroutine to perform the steps of the method for executing the fetched instruction.

10. The system according to 7, wherein the instruction comprises a move data instruction comprising
  moving a block of data from a source address space associated with the source access key to a target address space associated with the target access key.

11. The system according to claim 7, wherein the selecting the source access key and the selecting the target access key are performed during a move data operation within the processing environment.

12. The system according to claim 7, wherein the system is has an associated system address space, wherein the user register further comprises a source address space control, a first address space identifier, a target address space control and a second address space identifier comprising:
- based on the source address space control, using the source address space control to determine the source address space is any one of the system address space and an address space identified by the first address space identifier; and
- based on the target address space control, using the target address space control to determine the target address space is any one of the system address space and an address space identified by the second address space identifier.

13. An article of manufacture for facilitating storage access within a processing environment, the article of manufacture comprising:
- a tangible storage medium readable by a processing circuit and storing instructions for execution by the processing circuit for performing a method comprising:
  - fetching an instruction for execution, the instruction being defined for computer execution according to a computer architecture, the instruction having an associated plurality of user registers comprising a source user register, the source user register comprising a source control and a target control, the source user register comprising an access key associated with the source control and an access key associated with the target control;
  - executing the fetched instruction, the execution comprising:
    - selecting a source access key to be used to control access to a source operand, wherein the selecting comprises using the source control to select the source access key from one of the source user register and a system register, wherein selection of the source access key from the source user register overrides designation of the source access key in the system register, if any;
    - selecting a target access key to be used to control access to a target operand, wherein the selecting comprises using the target control to select the target access key from one of the target user register and the system register, wherein selection of the target access key from the target user register overrides designation of the target access key in the system register, if any, and wherein the selecting of the target access key is independent of the selecting of the source access key; and
    - using the source access key to control access to the source operand and the target access key to control access to the target operand.

14. The article of manufacture of claim 11, wherein the system register comprises a program status word used to control instruction execution in the processing environment.

15. The article of manufacture of claim 13, wherein the selecting the source access key and the selecting the target access key are performed during a move data operation within the processing environment.

16. The article of manufacture according to claim 13, wherein the instruction is fetched and executed by a central processing unit of an alternate computer architecture, the method comprising:
- interpreting the fetched instruction to identify a predetermined software subroutine for emulating the operation of the instruction, the predetermined software subroutine comprising a plurality of instructions; and
- executing the predetermined software subroutine to perform the steps of the method for executing the fetched instruction.

17. The article of manufacture of claim 13, wherein the instruction comprises a move data instruction comprising
- moving a block of data from a source address space associated with the source access key to a target address space associated with the target access key.

18. The article of manufacture according to claim 17, wherein the system is has an associated system address space, wherein the user register further comprises a source address space control, a first address space identifier, a target address space control and a second address space identifier comprising:
- based on the source address space control, using the source address space control to determine the source address space is any one of the system address space and an address space identified by the first address space identifier; and
- based on the target address space control, using the target address space control to determine the target address space is any one of the system address space and an address space identified by the second address space identifier.

* * * * *